(12) United States Patent
Kim et al.

(10) Patent No.: US 7,988,785 B2
(45) Date of Patent: Aug. 2, 2011

(54) PRINTING HEAD FOR NANO PATTERNING

(75) Inventors: Dong-Soo Kim, Taejon (KR); Won-Hee Lee, Taejon (KR); Taek-Min Lee, Seoul (KR); Doo-Sun Choi, Taejon (KR); Byung-Oh Choi, Taejon (KR)

(73) Assignee: Korea Institute of Machinery & Materials, Taejon (KR)

( * ) Notice: Subject to any disclaimer, the term of this patent is extended or adjusted under 35 U.S.C. 154(b) by 0 days.

(21) Appl. No.: 12/749,789

(22) Filed: Mar. 30, 2010

(65) Prior Publication Data

US 2010/0188449 A1 Jul. 29, 2010

(30) Foreign Application Priority Data

Mar. 26, 2004 (KR) ................ PCT/KR2004/000687
Nov. 6, 2006 (KR) ........................ 10-2003-078338

(51) Int. Cl.
*C23C 16/00* (2006.01)
*B41J 2/045* (2006.01)

(52) U.S. Cl. .................... 118/720; 118/723 VE; 347/68

(58) Field of Classification Search .................... 347/68; 118/720, 723 VE
See application file for complete search history.

(56) References Cited

U.S. PATENT DOCUMENTS

| | | | |
|---|---|---|---|
| 6,399,362 B1 | 6/2002 | Pui et al. | |
| 6,797,945 B2 * | 9/2004 | Berggren et al. | 250/288 |
| 2002/0083866 A1 | 7/2002 | Arita et al. | |
| 2002/0094533 A1 | 7/2002 | Hess et al. | |
| 2002/0136821 A1 | 9/2002 | Yamagata et al. | |

FOREIGN PATENT DOCUMENTS

| | | |
|---|---|---|
| KR | 1999-023939 A | 3/1999 |
| KR | 10-0327251 B1 | 3/2002 |

(Continued)

OTHER PUBLICATIONS

Office Action dated Apr. 27, 2010, issued in U.S. Appl. No. 11/417,114.

*Primary Examiner* — Karla Moore
(74) *Attorney, Agent, or Firm* — Holme Roberts & Owen LLP (57) ABSTRACT

The present invention provides a printing head for nano patterning including a manifold for accommodating a liquid printing material, a cartridge with an injection chamber communicating with the manifold, and a sample holder for patterning installed outside the injection chamber of the cartridge. The printing head comprises a shadow mask which is installed outside the injection chamber to be finely moved in an X-Y direction and has a single injection hole with a relatively very small size; an actuator for finely moving the shadow mask; an injection-inducing unit including a high voltage generator, a power supply electrode that is installed within the injection chamber and receives power from the high voltage generator to generate positive charges, and an opposite electrode for generating negative charges on the sample holder in a state where the shadow mask is interposed between the power supply electrode and the opposite electrode, thereby generating induced discharge from the injection chamber toward the sample holder; and a control unit for controlling the driving of the actuator so that the injection hole of the shadow mask can be moved to patterning positions corresponding to patterning data input in advance. According to the present invention, patterning accuracy can be improved, ultra-fine patterning and patterning of arbitrary shapes can be achieved, and a configuration for injecting the printing material can be simplified.

3 Claims, 4 Drawing Sheets

| | FOREIGN PATENT DOCUMENTS | | WO | 2004/000687 W | 5/2005 |
|---|---|---|---|---|---|
| KR | 10-0374589 B1 | 3/2003 | WO | 2005/044568 A1 | 5/2005 |
| KR | 2003-0045780 A | 6/2003 | * cited by examiner | | |

PRINTING HEAD FOR NANO PATTERNING

This application is a Divisional of application Ser. No. 11/417,114, filed May 4, 2006. This invention claims the benefit of Korean Patent Application No. 10-2003-078338 filed in Korea on Nov. 6, 2003 and International Patent Application No. PCT/KR2004/000687, filed on Mar. 26, 2004, which is hereby incorporated by reference in its entirety.

TECHNICAL FIELD

The present invention relates to a printing head for nano patterning, and more particularly, to a printing head for nano patterning, wherein the structure of a shadow mask and an injection configuration are improved so that patterning accuracy can be enhanced and ultra-fine nano patterning and the patterning of arbitrary shapes can be achieved.

BACKGROUND ART

As for typical examples of methods for patterning integrated circuits and microstructures in nano technologies such as semiconductor technology, there are lithography and etching.

However, patterning methods using lithography and etching have problems in that a great deal of time is required for processes, contamination occurs due to foreign materials introduced during a patterning process, there is a limitation on employing materials, and accuracy is lowered due to complicated processes.

To solve such problems, there has been disclosed a technique for patterning semiconductor integrated circuits and microstructures using a printing head that has been used in the ink-jet printing field.

Figure 1:
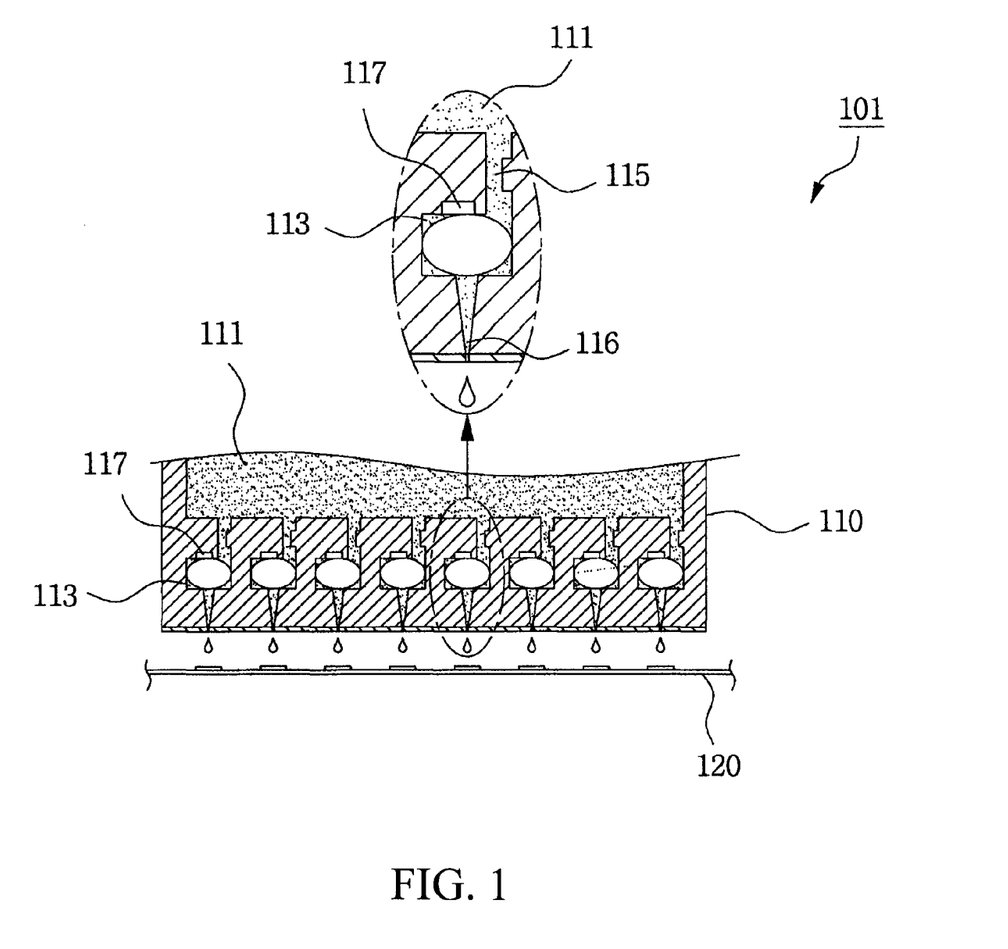
FIG. 1 is a sectional view of a conventional printing head for nano patterning.

FIG. 1 is a sectional view schematically showing a conventional printing head for patterning. As shown in the figure, the conventional printing head 101 is provided with a manifold 111 for accommodating a printing material (ultra-fine particles, adhesive solution, polymer or the like) in a cartridge 110 thereof. A plurality of injection chambers 113 as independent spaces are formed below the manifold 111.

Each injection chamber 113 is connected to the manifold 111 through a liquid supply passage 115. A nozzle 116 is formed at a lower portion of the injection chamber 113 so that the printing material can be injected to the outside. At this time, a heater (or piezo-PZT) 117 for generating bubbles within the injection chamber 113 is provided at an upper portion of the injection chamber 113. When bubbles are generated within the injection chamber 113 by driving the heater (or PZT) 117, the printing material contained in the injection chamber 113 is injected to the outside through the nozzle 116 due to pressure produced by the bubbles.

The printing head 101 patterns semiconductor integrated circuits or microstructures on a sample holder 120 by injecting the printing material onto patterning areas in the sample holder while moving toward positions corresponding to predetermined patterning coordinates by means of control operations of a control unit (not shown).

In the meantime, when the printing material is injected through the nozzle due to the pressure produced by the bubbles in the conventional printing head for patterning, the nozzle should be sized to be relatively larger in diameter in consideration of surface tension produced therein.

Further, there is a problem in that it is difficult to perform ultra-fine patterning and the patterning of arbitrary shapes since areas to be patterned with the printing material are limited to operating areas of the printing head.

DISCLOSURE OF THE INVENTION

Therefore, an object of the present invention is to provide a printing head for nano patterning, wherein patterning accuracy can be improved and ultra-fine patterning and the patterning of arbitrary shapes can be achieved.

According to the present invention for achieving the object, there is provided a printing head for nano patterning including a manifold for accommodating a liquid printing material, a cartridge with an injection chamber communicating with the manifold, and a sample holder for patterning installed outside the injection chamber of the cartridge, comprising a shadow mask which is installed outside the injection chamber to be finely moved in an X-Y direction and has a single injection hole with a relatively very small size; an actuator for finely moving the shadow mask; an injection-inducing unit including a high voltage generator, a power supply electrode that is installed within the injection chamber and receives power from the high voltage generator to generate positive charges, and an opposite electrode for generating negative charges on the sample holder in a state where the shadow mask is interposed between the power supply electrode and the opposite electrode, thereby generating induced discharge from the injection chamber toward the sample holder; and a control unit for controlling the driving of the actuator so that the injection hole of the shadow mask can be moved to patterning positions corresponding to patterning data input in advance.

The injection-inducing unit may further comprise a capillary which causes the injection chamber to communicate with the manifold and has the power supply electrode installed therein, and a gas-supplying unit including a gas supplier for supplying a reactant gas into the capillary and a gas-supplying hose for connecting the gas supplier to the capillary, thereby generating discharge plasma from the power supply electrode toward the opposite electrode through the capillary.

The injection-inducing unit may further comprise a piezoelectric element installed within the injection chamber and electrically connected to the power supply electrode, and a high frequency generator for applying high frequency to the piezoelectric element.

The control unit may primarily move the printing head to positions corresponding to the patterning data and then secondarily move the shade mask by driving the actuator.

The diameter of the injection hole may be equal to or less than 100 nm.

BRIEF DESCRIPTION OF THE DRAWINGS

The above and other objects, features and advantages of the present invention will become apparent from the following description of preferred embodiments given in conjunction with the accompanying drawings, in which.

BEST MODE FOR CARRYING OUT THE INVENTION

Hereinafter, preferred embodiments of the present invention will be described in detail with reference to the accompanying drawings.

Figure 2:
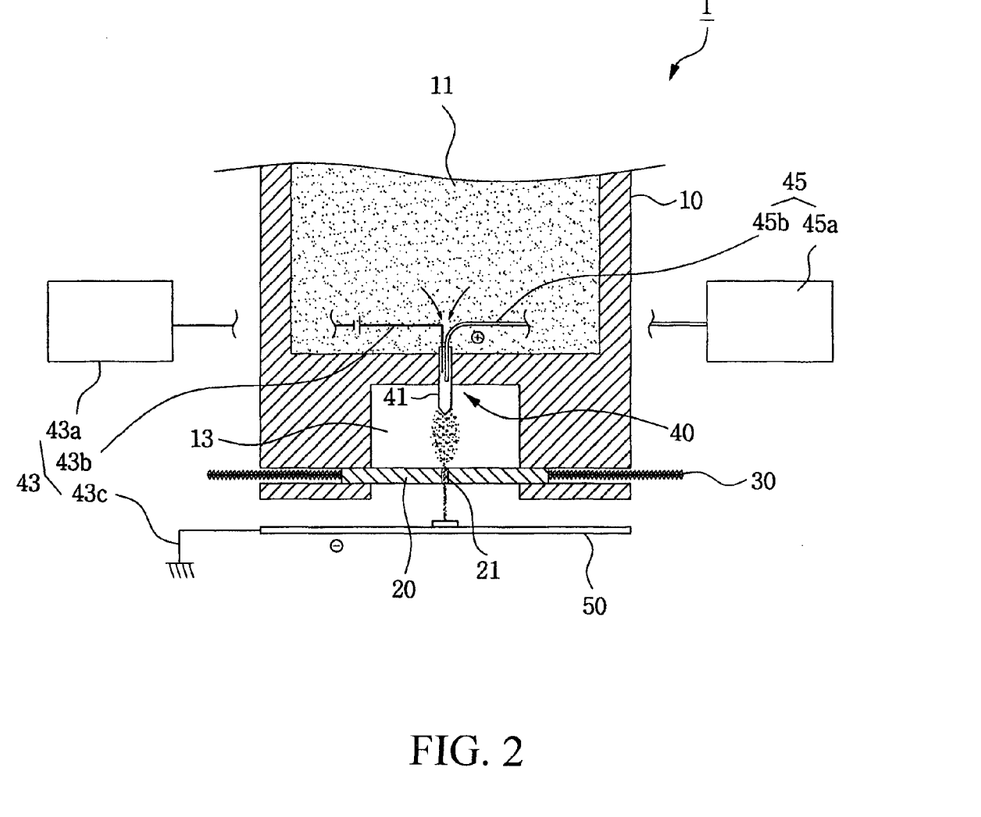
FIG. 2 is a sectional view schematically showing a printing head for patterning according to an embodiment of the present invention.
Figure 3:
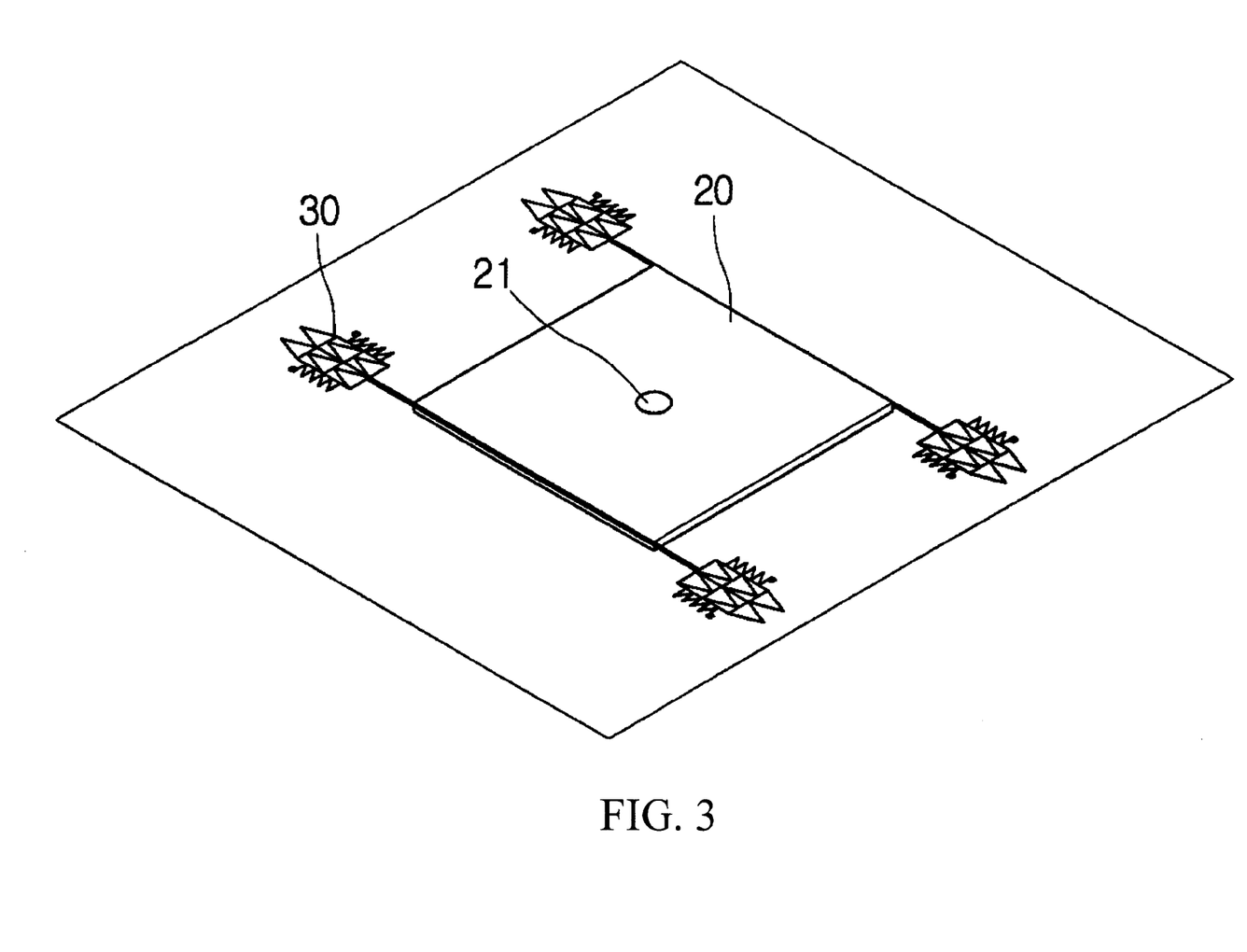
FIG. 3 is a perspective view showing a region of FIG. 2 where a shadow mask is installed.

FIG. 2 is a sectional view schematically showing a printing head for patterning according to an embodiment of the present invention, and FIG. 3 is a perspective view showing a region of FIG. 2 where a shadow mask is installed. As shown in these figures, the printing head 1 for patterning according to the embodiment of the present invention comprises a cartridge 10 for accommodating a printing material, an injection-inducing unit 40 for inducing the injection of the printing material accommodated in the cartridge 10 to the outside, a shadow mask 20 that has a single injection hole 21 and is installed below the cartridge 10 to be finely moved so that areas on which the printing material will be injected can be controlled, an actuator 30 for finely moving the shadow mask 20, and a control unit (not shown) for controlling the driving of the printing head 1 and the actuator 30.

A manifold 11 for accommodating the printing material is formed within the cartridge 10. An injection chamber 13 as a single space with a predetermined size is formed below the manifold 11. The printing material accommodated in the manifold 11 may be an organic or inorganic material such as a liquid conjugate polymer for patterning integrated circuits in the semiconductor field, a liquid binder material for powder bonding in three dimensional printing (3DP) in the rapid prototyping field, or a printing ink in the print field, according to a target on which patterning will be performed.

The injection-inducing unit 40 is an electrospray deposition type, and comprises a capillary 41 for causing the injection chamber 13 to communicate with the manifold 11, a plasma-generating unit 43 for generating plasma within the capillary 41, and a gas-supplying unit 45a for supplying a reactant gas into the capillary 41.

The capillary 41 serves as a supply passage for causing the liquid printing material accommodated in the manifold 11 to be supplied to the injection chamber 13 and simultaneously defines a space in which the liquid printing material is converted into gas due to the plasma generated within the capillary 41.

The plasma-generating unit 43 comprises a power supply electrode 43b that is provided in the form of fins and electrically connected to an external power supply portion 43a to generate positive charges, and an opposite electrode 43c that is grounded to a sample holder 50 on which the printing material will be patterned and faces the power supply electrode 43b in a state where the shadow mask 20 is interposed therebetween so as to generate negative charges. That is, the shadow mask 20 is disposed between the opposite electrode 43c and the capillary 42 with the power supply electrode 43b installed therein.

The plasma-generating unit 43 generates discharge plasma from the power supply electrode 43b toward the opposite electrode 43c through the capillary 41, so that the printing material (less than about 50 nm) can be evaporated within the capillary 41 to which the reactant gas is supplied, then pass through the injection chamber 13 and be induced to be injected through the injection hole 21 of the shadow mask 20.

The gas-supplying unit 45 comprises a gas supplier 45a for supplying the reactant gas, and a gas-supplying hose 45b for guiding the reactant gas supplied by the gas supplier 45a into the capillary 41.

The shadow mask 20 is formed with the single injection hole 21 with a relatively small diameter. The shadow mask 20 is installed to be finely moved below the injection chamber 13 in an X-Y direction by means of the actuator 30. At this time, it is preferred that the diameter of the injection hole 21 be about 100 nm so that particles of the printing material evaporated within the capillary 41 can pass therethrough.

Areas on which the printing material will be injected are precise injection areas corresponding to the moved positions of the shadow mask 20 that is finely moved in an X-Y plane by means of the driving of the actuator 30.

The actuator 30 is a micro part and is electrically connected to the control unit (not shown) and driven based on patterning data transmitted from the control unit (not shown) to finely move the shadow mask 20 in the X-Y plane. At this time, the actuator 30 is driven under the control of the control unit (not shown), and the moving direction of the shadow mask 20 conforms to the patterning data input into the control unit (not shown).

The control unit (not shown) operates the shadow mask 20 by primarily controlling the driven position of the printing head 1 based on the patterning data input in advance and secondarily controlling the driving of the actuator 30, thereby setting areas on which the printing material will be injected. Here, it is preferred that the configuration for driving the printing head 1 be constructed in the same manner as printing heads employed in the general semiconductor fabrication filed, nano technology field and ink jetprint field.

With such a configuration, the process of patterning semiconductor integrated circuits or microstructures by the printing head 1 for patterning according to the present invention will be described below.

First, the control unit (not shown) primarily moves the printing head 1 to a patterning area based on patterning data input in advance. Then, the control unit drives the actuator 30 so that the injection hole 21 of the shadow mask 20 can be moved to a starting point for an initial patterning area, and operates the plasma-generating unit 43 so that the printing material accommodated in the manifold of the cartridge 10 can be injected onto the sample holder 50 to be patterned.

When the plasma-generating unit 43 is operated, positive charges are generated within the capillary 41 by means of the power supply electrode 43b installed in the capillary 41 and negative charges are generated on the sample holder 50 by means of the opposite electrode 43c, thereby generating discharge plasma from the capillary 41 directed toward the sample holder 50. Further, the reactant gas is supplied from the gas supplier to the capillary 41 through the gas-supplying hose 45b.

Accordingly, the liquid printing material accommodated within the manifold 11 is induced by the discharge plasma to the injection hole 21 of the shadow mask 20 through the capillary 41. At this time, the liquid printing material is evaporated into gaseous fine particles due to the reactant gas supplied into the capillary 41 and the discharge plasma generated within the capillary 41, passes through the injection chamber 13, and is then patterned on a target surface of the sample holder 50 to be patterned through the injection hole 21 of the shadow mask 20.

Further, the control unit (not shown) continuously drives the actuator 30 so that the shadow mask 20 can be secondarily finely moved to injection areas corresponding to patterning data. With the driving of the actuator 30, the shadow mask 20 is finely moved in the X-Y direction and thus the injection areas on which the printing material will be injected through the single injection hole 21 can be accurately controlled, thereby achieving accurate patterning.

The control unit (not shown) repeats such control processes to control the continuous and precise patterning operations of the printing head 1.

Figure 4:
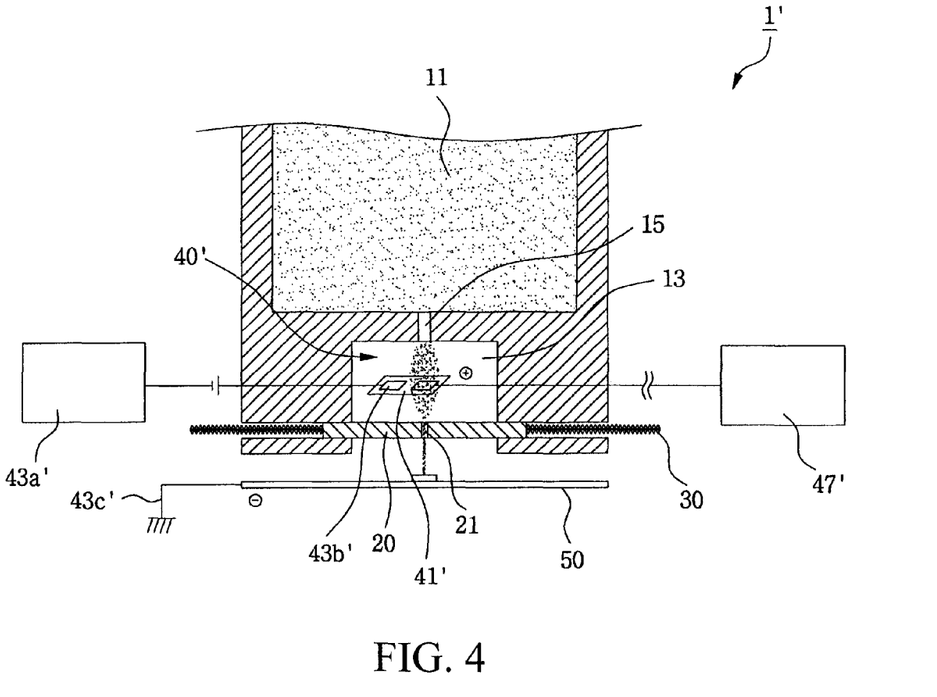
FIG. 4 is a sectional view of a printing head for patterning according to another embodiment of the present invention.

Meanwhile, FIG. 4 shows a schematic sectional view of a printing head for nano patterning according to another embodiment of the present invention. As shown in the figure, the printing head 1' for nano patterning according to the embodiment is identical to the printing head 1 for nano patterning according to the previous embodiment in their constitutions except an injection-inducing unit 40'. Therefore, only the injection-inducing unit 40' of the printing head 1' for nano patterning and an injection-inducing process according to this embodiment will be described below.

The injection-inducing unit 40' of the printing head 1' for nano patterning according to this embodiment is a surface acoustic wave electrostatic deposition (SAW-ED) type, and comprises a vibration diaphragm 41' installed within the injection chamber 13 communicating with the manifold 11 of the cartridge 10 through a supply passage, high vibration generating actuator (SAW, 43b') attached to the vibration diaphragm 41' to generate high vibration in the vibration diaphragm 41', and a high frequency generator 43a' for applying high frequency to the SAW 43b'. Further, the liquid printing material flowing down through a nozzle 15 from the manifold 11 reaches the vibration diaphragm 41', and a high voltage generator 47' for applying high voltage to the printing material that has reached the vibration diaphragm 41' to generate positive charges is connected to the vibration diaphragm 41'. The injection-inducing unit 40' further comprises an opposite electrode 43c' that is grounded to the sample holder 50 on which the printing material will be patterned in a state where the shadow mask 20 is interposed between the opposite electrode 43c' and the high voltage generator 47' so as to generate negative charges opposing the positive charges generated by the high voltage generator 47'. That is, the shadow mask 20 is disposed between the opposite electrode 43c' and the injection chamber 13 with the SAW 43b as a power supply electrode installed therein.

In the injection-inducing unit 40', power supplied by the high voltage generator 47' is applied to the vibration diaphragm 41' to cause the liquid printing material remaining on the vibration diaphragm 41' to have positive charges. Then, high frequency from the high frequency generator 43a' is applied to the SAW 43b' attached to the vibration diaphragm 41' to vibrate the vibration diaphragm with the high frequency. Thus, the liquid printing material with the positive charges is evaporated into ultra-fine gaseous particles that in turn are induced to be injected through the injection hole 21 of the shadow mask 20 onto the sample holder 50 with the negative charges.

Accordingly, it is possible to eliminate the limitation on reduction in the diameter of the nozzle due to surface tension therein in the conventional printing head for patterning by forming the single fine injection hole in the shadow mask and evaporating the liquid printing material into ultra-fine gaseous particles using the electrodes to be patterned on the surface of the sample holder through the injection hole of the shadow mask. Therefore, since an ultra-fine injection hole can be formed in the shadow mask, it is possible to pattern ultra-fine integrated circuits or microstructures.

Further, ultra-fine patterning and patterning of arbitrary shapes can be achieved by finely moving the shadow mask using the actuator and causing the control unit to control the driving of the actuator based on patterning data input in advance so that the patterning areas on which the printing material will be patterned can be accurately controlled with the operation region of the printing head and the moving region of the shadow mask.

INDUSTRIAL APPLICABILITY

According to the present invention described above, there is provided a printing head for nano patterning, wherein patterning accuracy can be improved and the ultra-fine patterning and the patterning of arbitrary shapes can be achieved.

The invention claimed is:

1. A printing head for nano patterning including;
   a cartridge which has an injection chamber having an opening at a lower side of the cartridge;
   a manifold for accommodating liquid printing material, the manifold being formed at an inner space of the cartridge to communicate with the injection chamber through a hole;
   a sample holder for patterning installed outside the injection chamber of the cartridge;
   a shadow mask which is installed outside the injection chamber to be finely moved in an X-Y direction and has a single injection hole, the shadow mask covering the opening of the injection chamber and slidably mounted on the cartridge;
   an actuator for finely moving the shadow mask, the actuator being mounted at the cartridge and connected to the shadow mask;
   an injection-inducing unit for generating induced discharge from the injection chamber toward the sample holder; and
   a control unit for controlling the driving of the actuator so that the injection hole of the shadow mask can be moved to patterning positions corresponding to patterning data input in advance;
   wherein the injection-inducing unit comprises:
   a high voltage generator;
   a vibration diaphragm that is installed within the injection chamber and receives power from the high voltage generator to generate positive charges;
   an opposite electrode for generating negative charges on the sample holder in a state where the shadow mask is interposed between the vibration diaphragm and the opposite electrode;
   a piezoelectric element attached to the vibration diaphragm for generating high vibration in the vibration diaphragm; and
   a high frequency generator connected to the piezoelectric element for applying high frequency to the piezoelectric element.

2. The printing head as claimed in claim 1, wherein the control unit is configured to control a driving unit of the printing head and the actuator of the shadow mask such that the printing head primarily moves to positions corresponding to the patterning data and the shadow mask secondarily moves to the patterning positions.

3. The printing head as claimed in claim 1, wherein the diameter of the injection hole is equal to or less than 100 nm.

* * * * *

UNITED STATES PATENT AND TRADEMARK OFFICE
CERTIFICATE OF CORRECTION

| | | |
|---|---|---|
| PATENT NO. | : 7,988,785 B2 | Page 1 of 1 |
| APPLICATION NO. | : 12/749789 | |
| DATED | : August 2, 2011 | |
| INVENTOR(S) | : Dong-Soo Kim et al. | |

It is certified that error appears in the above-identified patent and that said Letters Patent is hereby corrected as shown below:

Foreign Application Priority Data, the priority date for KR 10-2003-078338 reading "Nov. 6, 2006" should be changed to -- Nov. 6, 2003 -- and should appear as follows:

Mar. 26, 2004 (KR).................PCT/KRKR2004/000687
Nov. 6, 2003   (KR).................10-2003-078338

Claim 1, col. 6 the end of the first line reading "including;" should be changed to -- including: -- and should appear as follows:

1. A printing head for nano patterning including:

Signed and Sealed this
Eighteenth Day of October, 2011

David J. Kappos
*Director of the United States Patent and Trademark Office*

UNITED STATES PATENT AND TRADEMARK OFFICE
CERTIFICATE OF CORRECTION

PATENT NO. : 7,988,785 B2  
APPLICATION NO. : 12/749789  
DATED : August 2, 2011  
INVENTOR(S) : Dong-Soo Kim et al.

Page 1 of 1

It is certified that error appears in the above-identified patent and that said Letters Patent is hereby corrected as shown below:

Title Page, Item (30) Foreign Application Priority Data, the priority date for KR 10-2003-078338 reading "Nov. 6, 2006" should be changed to -- Nov. 6, 2003 -- and should appear as follows:

Mar. 26, 2004 (KR).................PCT/KRKR2004/000687  
Nov. 6, 2003  (KR).................10-2003-078338

Column 6, line 15, (Claim 1, line 1) the end of the first line reading "including;" should be changed to -- including: -- and should appear as follows:

1. A printing head for nano patterning including:

This certificate supersedes the Certificate of Correction issued October 18, 2011.

Signed and Sealed this  
Twenty-second Day of November, 2011

David J. Kappos  
*Director of the United States Patent and Trademark Office*